(12) United States Patent
Hsu et al.

(10) Patent No.: US 11,164,829 B2
(45) Date of Patent: *Nov. 2, 2021

(54) METHOD OF FORMING CONTACT HOLES IN A FAN OUT PACKAGE

(71) Applicant: Taiwan Semiconductor Manufacturing Company, Ltd., Hsinchu (TW)

(72) Inventors: Feng-Cheng Hsu, New Taipei (TW); Szu-Wei Lu, Hsinchu (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/567,804

(22) Filed: Sep. 11, 2019

(65) Prior Publication Data
US 2020/0006264 A1 Jan. 2, 2020

Related U.S. Application Data

(62) Division of application No. 15/954,244, filed on Apr. 16, 2018, which is a division of application No.
(Continued)

(51) Int. Cl.
*H01L 23/00* (2006.01)
*H01L 23/48* (2006.01)
(Continued)

(52) U.S. Cl.
CPC ............ *H01L 24/02* (2013.01); *H01L 21/563* (2013.01); *H01L 23/481* (2013.01); *H01L 24/05* (2013.01);
(Continued)

(58) Field of Classification Search
CPC .................. H01L 24/05; H01L 24/13; H01L 2224/02379; H01L 2224/04105;
(Continued)

(56) References Cited

U.S. PATENT DOCUMENTS 5,830,804 A 11/1998 Cleeves et al.
8,785,299 B2 * 7/2014 Mao ..................... H01L 21/6835
438/464
(Continued)

FOREIGN PATENT DOCUMENTS

CN 102104011 B * 3/2013 ............. H01L 24/19
CN 102104011 B * 3/2013
(Continued)

*Primary Examiner* — Bitew A Dinke
(74) *Attorney, Agent, or Firm* — Slater Matsil, LLP

(57) ABSTRACT

Methods of forming packages include forming an encapsulant laterally encapsulating a die over an active surface of the die. The active surface has an electrical pad. A first opening is formed through the encapsulant to the electrical pad. In some embodiments the first opening is formed using a photolithographic technique. In some embodiments the first opening is formed using a temporary pillar by forming the temporary pillar over the electrical pad, forming the encapsulant, and then exposing and removing the temporary pillar. A conductive pattern is formed over the encapsulant including a via formed in the first opening to the electrical pad of the die's active surface. In some embodiments, a dielectric layer is formed over the encapsulant, and the conductive pattern is over the dielectric layer. Embodiments may include forming additional dielectric layers and conductive patterns.

20 Claims, 8 Drawing Sheets

Related U.S. Application Data

15/175,879, filed on Jun. 7, 2016, now Pat. No. 9,947,629, which is a division of application No. 14/103,253, filed on Dec. 11, 2013, now Pat. No. 9,379,041.

(51) Int. Cl.
*H01L 21/56* (2006.01)
*H01L 23/31* (2006.01)

(52) U.S. Cl.
CPC .............. *H01L 24/13* (2013.01); *H01L 24/19* (2013.01); *H01L 23/3128* (2013.01); *H01L 2224/02315* (2013.01); *H01L 2224/02331* (2013.01); *H01L 2224/02379* (2013.01); *H01L 2224/0401* (2013.01); *H01L 2224/04105* (2013.01); *H01L 2224/05024* (2013.01); *H01L 2224/12105* (2013.01); *H01L 2224/13026* (2013.01); *H01L 2224/32225* (2013.01); *H01L 2224/73267* (2013.01); *H01L 2224/92244* (2013.01); *H01L 2924/181* (2013.01)

(58) Field of Classification Search
CPC . H01L 2224/12105; H01L 2224/13008; H01L 2224/13024; H01L 2224/05008; H01L 2224/05548
See application file for complete search history.

(56) References Cited

U.S. PATENT DOCUMENTS

| | | | |
|---|---|---|---|
| 9,379,041 B2 * | 6/2016 | Hsu | H01L 24/19 |
| 9,947,629 B2 * | 4/2018 | Hsu | H01L 24/02 |
| 10,177,078 B2 | 1/2019 | Yu et al. | |
| 10,276,541 B2 | 4/2019 | Chen et al. | |
| 10,297,544 B2 | 5/2019 | Wu et al. | |
| 2004/0049912 A1 | 3/2004 | Akagawa et al. | |
| 2005/0006760 A1 * | 1/2005 | Terui | H01L 23/3114 257/734 |
| 2005/0122698 A1 * | 6/2005 | Ho | H01L 23/5389 361/761 |
| 2006/0145328 A1 | 7/2006 | Hsu | |
| 2007/0241457 A1 | 10/2007 | Ida | |
| 2008/0029895 A1 | 2/2008 | Hu et al. | |
| 2008/0191326 A1 * | 8/2008 | Lin | H01L 23/49822 257/666 |
| 2008/0224249 A1 | 9/2008 | Nabe et al. | |
| 2008/0237836 A1 * | 10/2008 | Chia | H01L 21/568 257/698 |
| 2008/0296273 A1 | 12/2008 | Lei et al. | |
| 2008/0303136 A1 * | 12/2008 | Mori | H01L 23/5389 257/700 |
| 2009/0039491 A1 | 2/2009 | Kim et al. | |
| 2010/0013087 A1 | 1/2010 | England | |
| 2010/0072599 A1 * | 3/2010 | Camacho | H01L 25/105 257/686 |
| 2011/0042796 A1 | 2/2011 | Chang et al. | |
| 2011/0121445 A1 * | 5/2011 | Mori | H01L 24/19 257/693 |
| 2011/0215450 A1 | 9/2011 | Chi et al. | |
| 2011/0215464 A1 * | 9/2011 | Guzek | H01L 21/56 257/737 |
| 2011/0215478 A1 | 9/2011 | Yamamichi et al. | |
| 2011/0221069 A1 * | 9/2011 | Kunimoto | H01L 23/5389 257/774 |
| 2011/0241215 A1 | 10/2011 | Sankman et al. | |
| 2011/0291249 A1 | 12/2011 | Chi et al. | |
| 2012/0119379 A1 * | 5/2012 | Koizumi | H01L 24/20 257/774 |
| 2012/0161279 A1 | 6/2012 | Lin et al. | |
| 2012/0161331 A1 | 6/2012 | Gonzalez et al. | |
| 2013/0001762 A1 * | 1/2013 | Chi | H01L 23/5389 257/676 |
| 2013/0001776 A1 * | 1/2013 | Yu | H01L 24/19 257/738 |
| 2013/0049195 A1 | 2/2013 | Wu et al. | |
| 2013/0093078 A1 * | 4/2013 | Lin | H01L 25/0657 257/737 |
| 2013/0105982 A1 | 5/2013 | Jin et al. | |
| 2013/0134559 A1 | 5/2013 | Lin et al. | |
| 2013/0168849 A1 | 7/2013 | Scanlan | |
| 2013/0168874 A1 | 7/2013 | Scanlan | |
| 2013/0187270 A1 * | 7/2013 | Yu | H01L 24/05 257/737 |
| 2013/0210198 A1 | 8/2013 | Lin | |
| 2013/0241077 A1 | 9/2013 | Fuergut et al. | |
| 2013/0249104 A1 | 9/2013 | Chi et al. | |
| 2013/0264684 A1 * | 10/2013 | Yu | H01L 21/561 257/616 |
| 2013/0307143 A1 | 11/2013 | Lin et al. | |
| 2013/0320553 A1 | 12/2013 | Kuo et al. | |
| 2013/0341800 A1 | 12/2013 | Tu et al. | |
| 2014/0008809 A1 | 1/2014 | Scanlan | |
| 2014/0070396 A1 * | 3/2014 | Kyozuka | H01L 24/24 257/698 |
| 2014/0091482 A1 * | 4/2014 | Lin | H01L 21/565 257/782 |
| 2014/0093999 A1 | 4/2014 | Teh et al. | |
| 2014/0110856 A1 | 4/2014 | Lin | |
| 2014/0252579 A1 | 9/2014 | Chang et al. | |
| 2014/0332975 A1 | 11/2014 | Raorane et al. | |
| 2014/0353838 A1 | 12/2014 | Lin et al. | |
| 2014/0363929 A1 * | 12/2014 | Malatkar | H01L 25/105 438/127 |
| 2014/0367160 A1 | 12/2014 | Yu et al. | |
| 2014/0367848 A1 * | 12/2014 | Chi | H01L 24/81 257/737 |
| 2015/0008587 A1 | 1/2015 | Lin et al. | |
| 2015/0123300 A1 | 5/2015 | Tanabe et al. | |
| 2016/0064329 A1 | 3/2016 | Lee et al. | |
| 2016/0197022 A1 * | 7/2016 | Pagaila | H01L 24/19 257/773 |
| 2017/0186703 A1 | 6/2017 | Chiang et al. | |
| 2018/0158746 A1 * | 6/2018 | Lin | H01L 24/19 |

FOREIGN PATENT DOCUMENTS

| | | |
|---|---|---|
| JP | 2001255556 A | 9/2001 |
| JP | 2007305960 A | 11/2007 |

* cited by examiner

METHOD OF FORMING CONTACT HOLES IN A FAN OUT PACKAGE

PRIORITY CLAIM AND CROSS-REFERENCE

This application is a divisional of U.S. application Ser. No. 15/954,244 filed Apr. 16, 2018, entitled "Method of Forming Contact Holes in a Fan Out Package", which is a divisional of U.S. application Ser. No. 15/175,879 filed on Jun. 7, 2016, issued as U.S. Pat. No. 9,947,629 on Apr. 17, 2018, which is a divisional of U.S. application Ser. No. 14/103,253, filed on Dec. 11, 2013, issued as U.S. Pat. No. 9,379,041 on Jun. 28, 2016, which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely fan-out package structures and methods of forming such structures. Embodiments may also be applied, however, to other package structures. Embodiments discussed herein are to provide examples to enable making or using the subject matter of this disclosure, and a person having ordinary skill in the art will readily understand modifications that can be made while remaining within contemplated scopes of different embodiments. Figures and discussion below illustrate simplified structures so as to not obscure various features and to omit redundant features that would be apparent to a person of ordinary skill in the art. Like reference numbers and characters in the figures below refer to like components. Although method embodiments may be discussed as being performed in a particular order, other method embodiments may be performed in any logical order.

Figure 1:
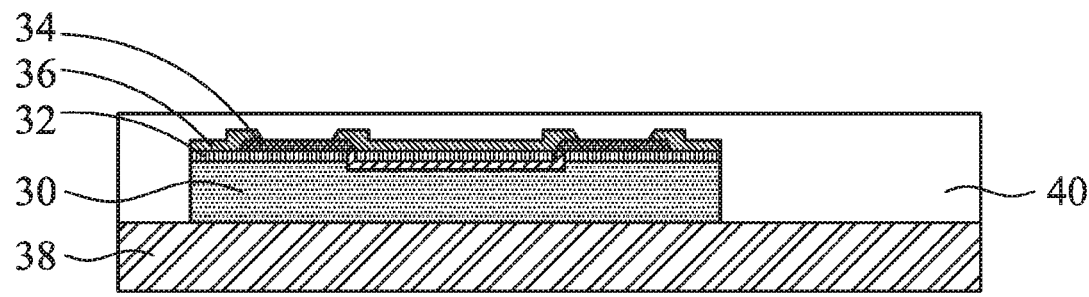
FIGS. 1 through 7 are various intermediate structures in a process according to an embodiment.

FIGS. 1 through 7 illustrate various intermediate structures in a process according to an embodiment. FIG. 1 illustrates a die 30 encapsulated by a dielectric-encapsulant 40. The die 30 includes a top metallization layer 32, a pad 34 (such as an electrical connector pad), and a passivation layer 36 on an active side of the die 30. The die 30 may be, for example, a logic integrated circuit, a memory die, an analog die, or any other die. The die 30 may comprise a semiconductor substrate, such as a bulk semiconductor substrate, semiconductor-on-insulator substrate, or the like, on which active devices, such as transistors, and/or passive devices, such as capacitors, inductors, or the like, are formed according to semiconductor processes. Metallization layers, including top metallization layer 32, may be on the semiconductor substrate and may comprise interconnect structures to electrically couple devices together and/or to a pad 34. The pads 34 are exposed through respective openings in the passivation layer 36.

In an example, the die 30 may be formed as part of a wafer. The wafer is singulated, such as by dicing or sawing, to form individual dies 30. The die 30 is placed on a carrier substrate 38, which may be a glass substrate, silicon substrate, aluminum oxide substrate, or the like, using, for example, a pick-and-place tool, and the die 30 is adhered to the carrier substrate 38 by a die attach film, such as any suitable adhesive, epoxy, ultraviolet (UV) glue (which loses its adhesive property when exposed to UV lights), or the like. The pads 34 and passivation layer 36 are placed opposite from the carrier substrate 38.

In FIG. 1, the dielectric-encapsulant 40 is formed laterally encapsulating the die 30 and over the passivation layer 36 and pads 34. As shown, the dielectric-encapsulant 40 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. The dielectric-encapsulant 40 can comprise epoxy molding compound or any other dielectric materials that sustains the die 30 embedded in encapsulant 40 over substrate 38, and may be formed using a compression molding process, a lamination process, or the like. In an embodiment, the dielectric-encapsulant 40 is photo-patternable.

Figure 2:
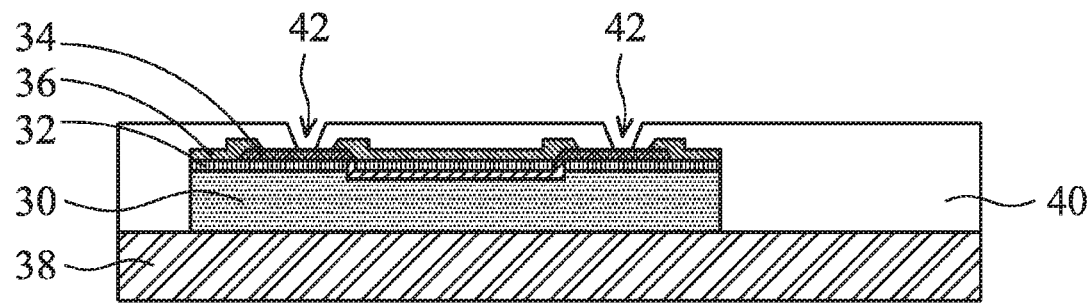

In FIG. 2, openings 42 are formed in the dielectric-encapsulant 40 to expose the pads 34. The openings 42 may be formed using an acceptable photolithography technique to expose the dielectric-encapsulant 40 to light. In such an embodiment, the dielectric-encapsulant 40 is developed and/or cured after the exposure.

Figure 3:
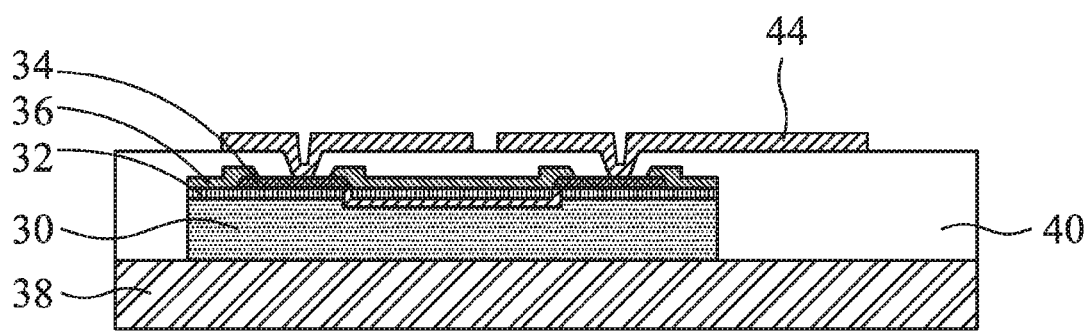
Figure 22:
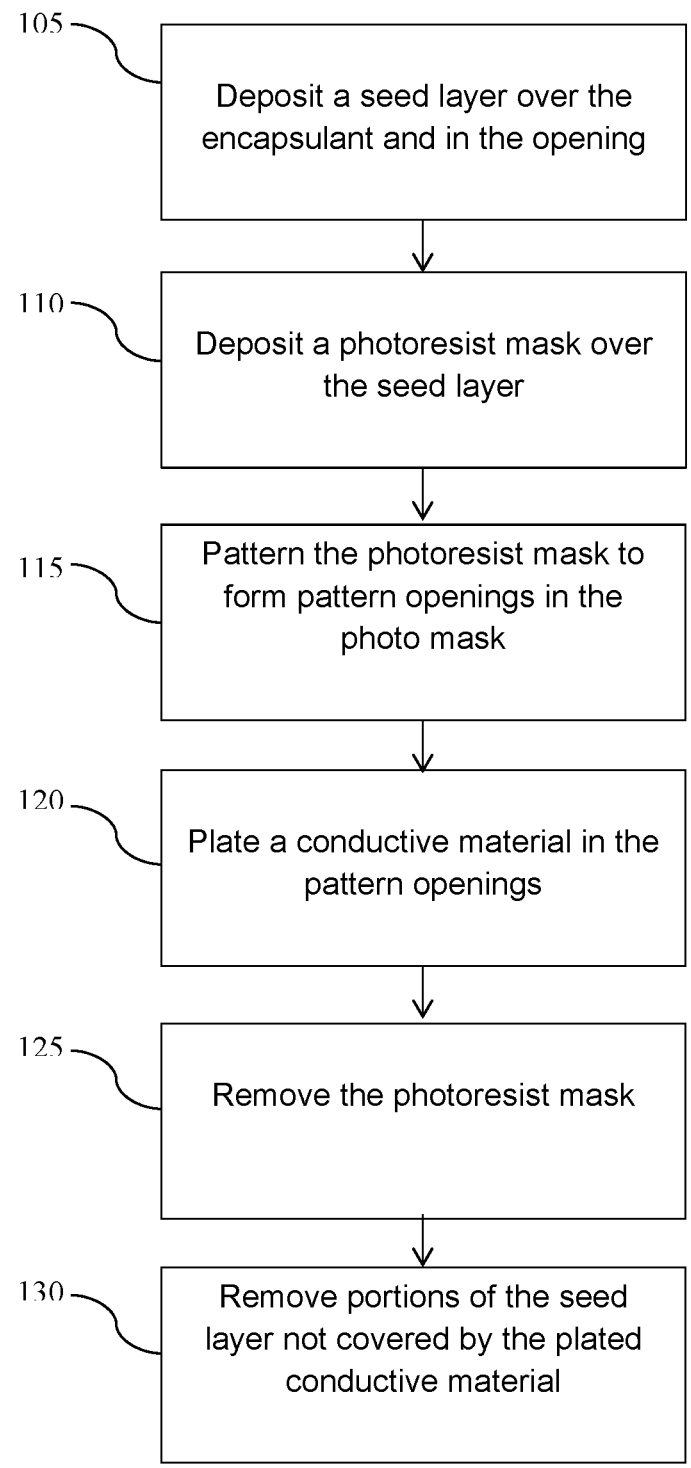
FIG. 22 illustrates a flow diagram of a deposition process for a conductive layer, in accordance with some embodiments.

In FIG. 3, a first conductive pattern 44 is formed over the dielectric-encapsulant 40 and in the openings 42 to the pads 34. The first conductive pattern 44 comprises various traces and/or vias, such as vias in the openings 42. The first conductive pattern 44 in an example comprises a metal such as copper, titanium, the like, or a combination thereof, formed by a plating process, such as electroless plating, electroplating, or the like. For example, as illustrated in FIG. 22, process 105, a seed layer is deposited over the dielectric-encapsulant 40 and in the openings 42. The seed layer can be copper, titanium, the like, or a combination thereof deposited by atomic layer deposition (ALD), sputtering, another physical vapor deposition (PVD) process, or the like. A photoresist is deposited and patterned exposing the pattern for the first conductive pattern 44 that is desired, such as by an acceptable photolithography technique, as illustrated in FIG. 22, processes 110 and 115. A conductive material, such as copper, aluminum, the like, or a combination thereof, is deposited on the seed layer by electroless plating, electroplating, or the like, as illustrated in FIG. 22, process 120. The photoresist is removed, such as an appropriate photoresist stripping process, as illustrated in FIG. 22, process 125. Remaining exposed seed layer portions are removed, such as by a wet or dry etch, as illustrated in FIG. 22, process 130.

Figure 4:
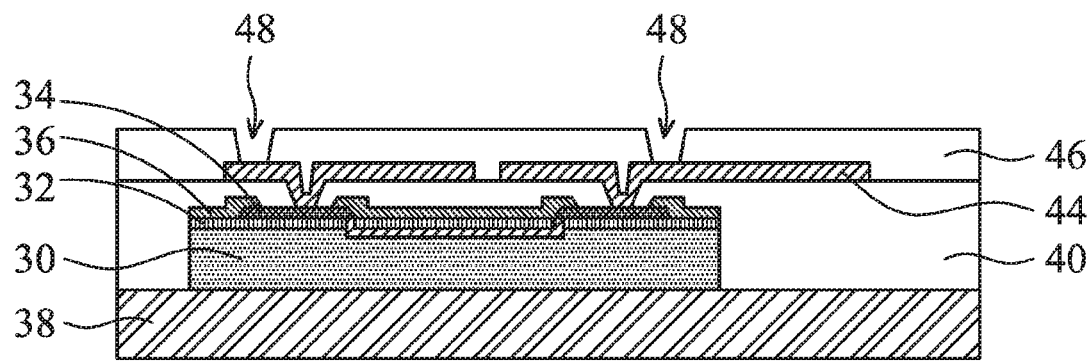

In FIG. 4, a second dielectric layer 46 is formed over the dielectric-encapsulant 40 and the first conductive pattern 44. The second dielectric layer 46 may comprise a polybenzoxazole (PBO), polyimide, benzocyclobutene (BCB), the like, or a combination thereof. The second dielectric layer 46 can be deposited by a spin coating process, laminating process, the like, or a combination thereof. Openings 48 are formed through the second dielectric layer 46 to portions of the first conductive pattern 44 using an acceptable photolithography technique, such as including exposing to light the portions of the second dielectric layer 46 where the openings 48 are to be formed. The second dielectric layer 46 may be developed and/or cured after the exposure.

Figure 5:
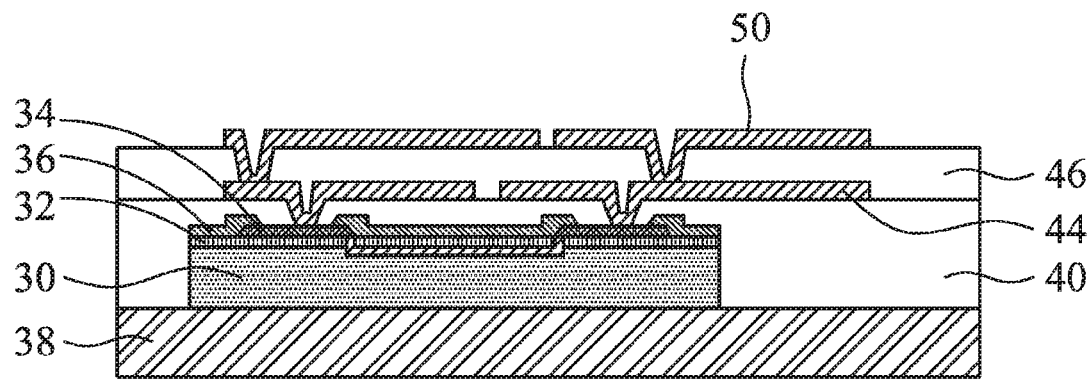

In FIG. 5, a second conductive pattern 50 is formed over the second dielectric layer 46 and in the openings 48 to the portions of the first conductive pattern 44. The second conductive pattern 50 comprises various traces and/or vias. The second conductive pattern 50 in an example comprises a metal such as copper, titanium, the like, or a combination thereof, formed by a plating process, such as electroless plating, electroplating, or the like, such as discussed above with respect to FIG. 3.

Figure 6:
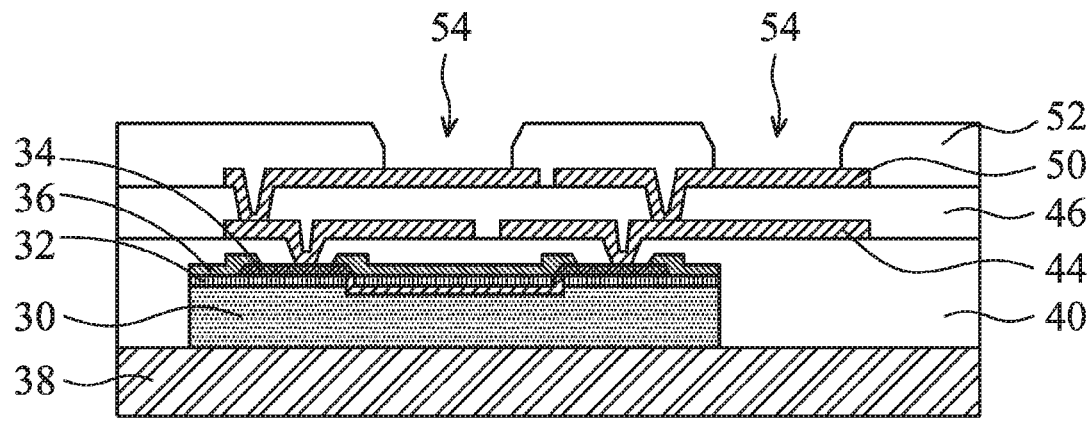

In FIG. 6, a third dielectric layer 52 is formed over the second dielectric layer 46 and the second conductive pattern 50. The third dielectric layer 52 may comprise a PBO, polyimide, BCB, the like, or a combination thereof. The third dielectric layer 52 can be deposited by a spin coating process, laminating process, the like, or a combination thereof. Openings 54 are formed through the third dielectric layer 52 to portions of the second conductive pattern 50 using an acceptable photolithography technique, such as including exposing to light the portions of the third dielectric layer 52 where the openings 54 are to be formed. The third dielectric layer 52 may be developed and/or cured after the exposure.

Figure 7:
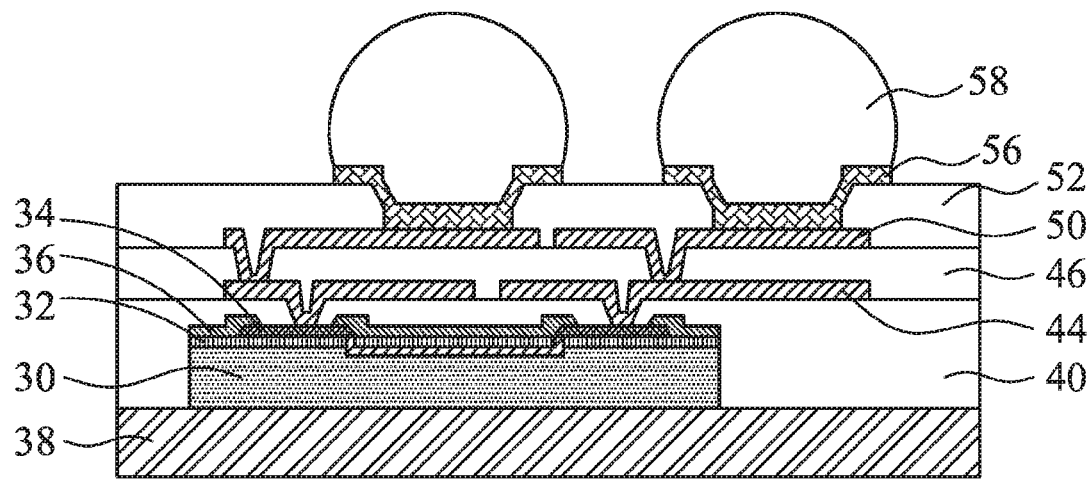

In FIG. 7, bond pads 56 and external electrical connectors 58 are formed. The bond pads 56 are formed directly coupled to the portions of the second conductive pattern 50, in the openings 54, and over a portion of a top surface of the third dielectric layer 52. The bond pads 56 in an example may each be an under bump metal (UBM) and may each comprise a metal such as copper, titanium, the like, or a combination thereof, formed by a plating process, such as electroless plating, electroplating, or the like, such as discussed above with respect to FIG. 3. The external electrical connectors 58, such as balls or bumps, are formed on respective bond pads 56. The external electrical connectors 58 may comprise solder, such as lead-free solder, and may be formed using an acceptable ball drop process. The formed package structure may then be removed from the carrier substrate 38, such as by exposing the die attach film to a solvent or UV light (when the die attach film is UV glue, for example).

Figure 8:
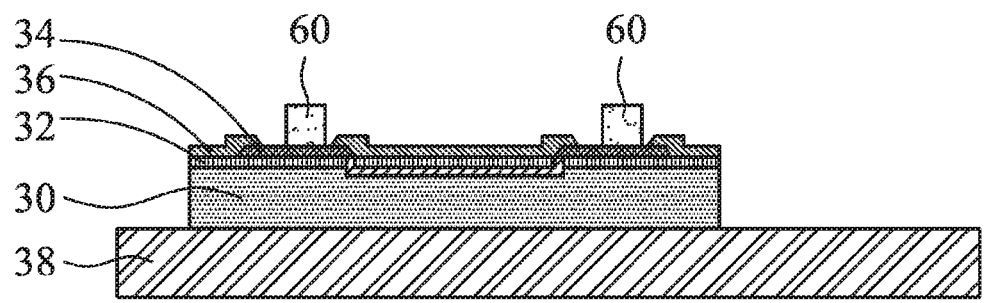
FIGS. 8 through 15 are various intermediate structures in various processes according to other embodiments.

FIGS. 8 through 15 illustrate various intermediate structures in various processes according to embodiments. For example, steps discussed with respect to FIG. 11 may replace steps in FIGS. 9 and 10. In FIG. 8, temporary pillars 60 are formed on pads 34 of the die 30. In an embodiment, the temporary pillars 60 are photoresist pillars. As discussed with respect to the example in FIG. 1, the die 30 may be formed as part of a wafer. Before singulation, a photoresist material may be formed over the wafer and patterned into the photoresist pillars. The wafer is then singulated to form individual dies 30, and the die 30 is attached to the carrier substrate 38 using a die attach film. In other embodiments, the temporary pillars 60 may be any material deposited and patterned, such as by using photolithography and etching techniques, on the pads 34, such as before or after singulation of the die 30.

Figure 9:
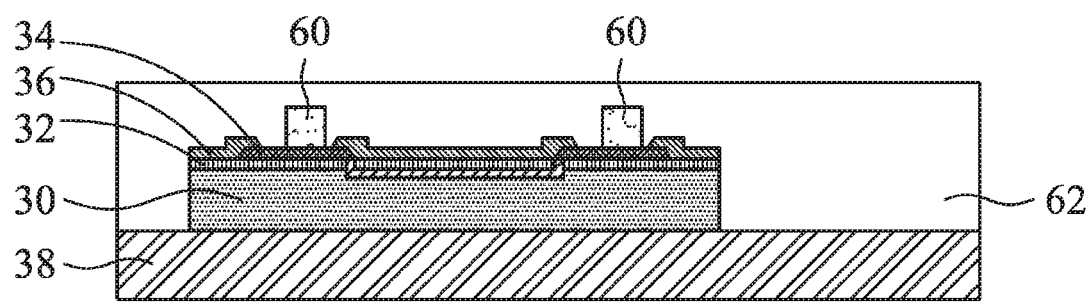
Figure 10:
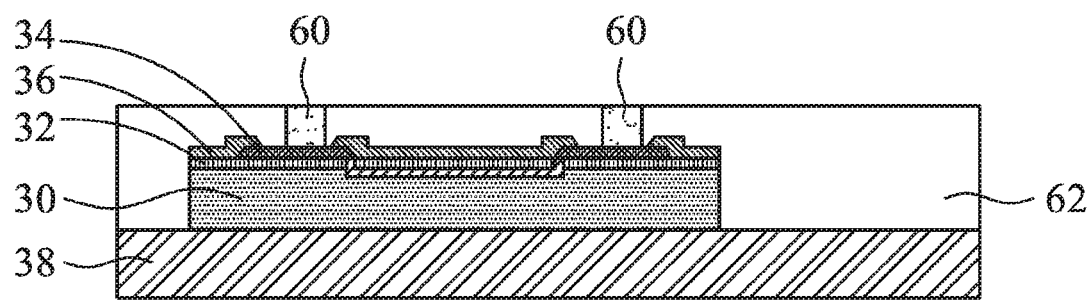

In FIG. 9, an encapsulant 62 is formed encapsulating the die 30 to a height greater than the height of the temporary pillars 60, and in FIG. 10, the encapsulant 62 is then ground back to expose the temporary pillars 60. The encapsulant 62 may be a molding compound, or the like, and may also have dielectric properties. The encapsulant 62 may be formed using a compression molding process, a lamination process, or the like, and then, may be cured. In FIG. 10, the encapsulant 62 is ground, such as by using a grinding wheel and/or chemical mechanical polish (CMP), to expose the temporary pillars 60.

Figure 11:
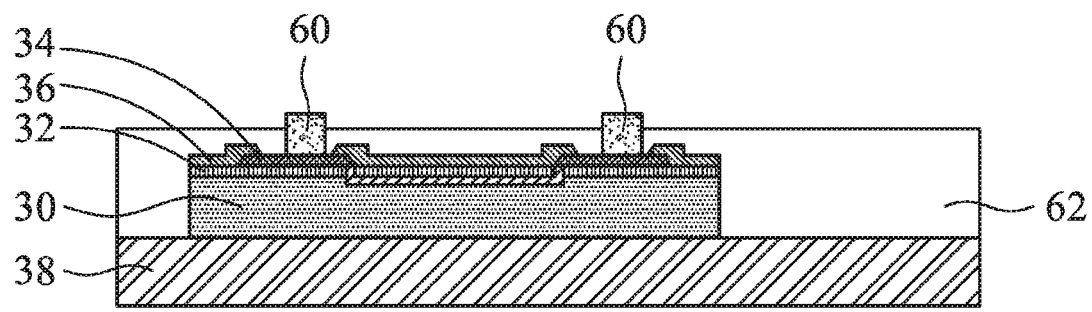

In FIG. 11, the encapsulant 62 is formed with the temporary pillars 60 being exposed through the encapsulant 62. The temporary pillars 60 may be exposed through the encapsulant 62, for example, by using a compression molding process with a compressible and releasable film on a mold plate. When the compression plate with the compressible film contacts the encapsulant 62, the temporary pillars 60 may be pressed into the compressible film, and the compressive force may cause the encapsulant to recede to a level below top portions of the temporary pillars 60. Example materials for a compressible film on the mold plate include silicone or the like. A compressible film may be, for example, 200 µm thick.

Figure 12:
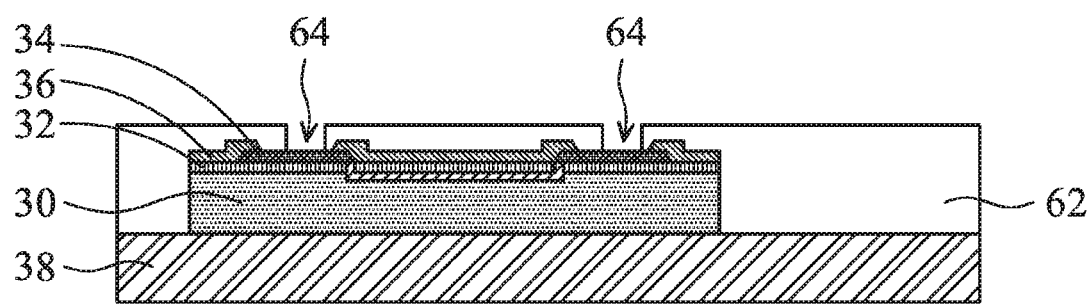

In FIGS. 10 and 11, the encapsulant 62 is formed laterally encapsulating the die 30 and over the passivation layer 36 and pads 34. As shown, the encapsulant 62 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. After FIG. 10 or FIG. 11, the temporary pillars 60 are removed to create openings 64 to the pads 34, as shown in FIG. 12. In embodiments where the temporary pillars 60 are a photoresist, the temporary pillars 60 may be removed using an appropriate stripping process. In other embodiments, the temporary pillars 60 may be removed by etching.

Figure 13:
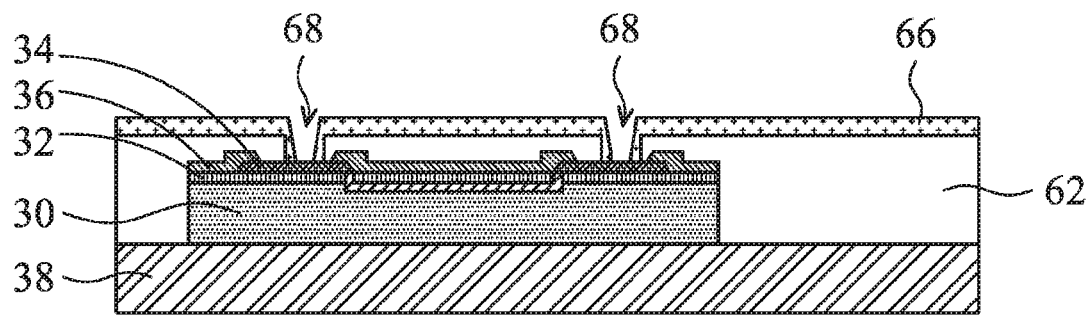

In FIG. 13, a first dielectric layer 66 is formed over the encapsulant 62 and is patterned to create openings 68 through openings 64 to expose the pads 34. The first dielectric layer 66 may comprise a PBO, polyimide, BCB, the like, or a combination thereof. The first dielectric layer 66 can be deposited by a spin coating process, laminating process, the like, or a combination thereof. Openings 68 are formed through the first dielectric layer 66 to the pads 34 using an acceptable photolithography technique, such as including exposing to light the portions of the first dielectric layer 66 where the openings 68 are to be formed. The first dielectric layer 66 may be developed and/or cured after the exposure.

Figure 14:
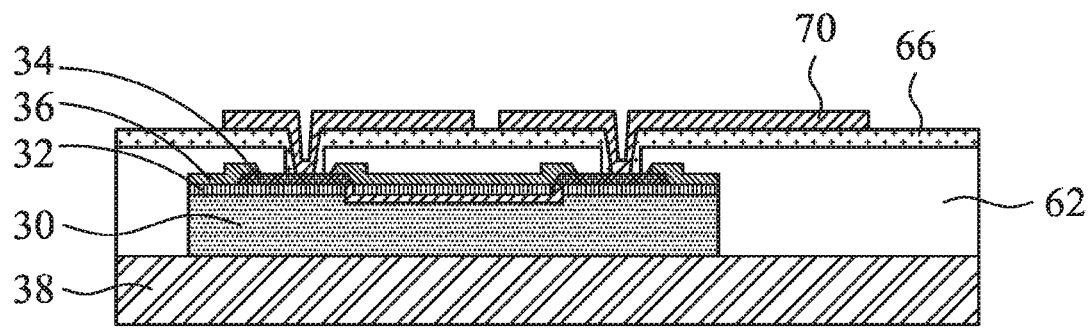

In FIG. 14, a first conductive pattern 70 is formed over the first dielectric layer 66 and in the openings 68 to the pads 34. The first conductive pattern 70 comprises various traces and/or vias. The first conductive pattern 70 in an example comprises a metal such as copper, titanium, the like, or a combination thereof, formed by a plating process, such as electroless plating, electroplating, or the like, such as discussed above with respect to FIG. 3.

Figure 15:
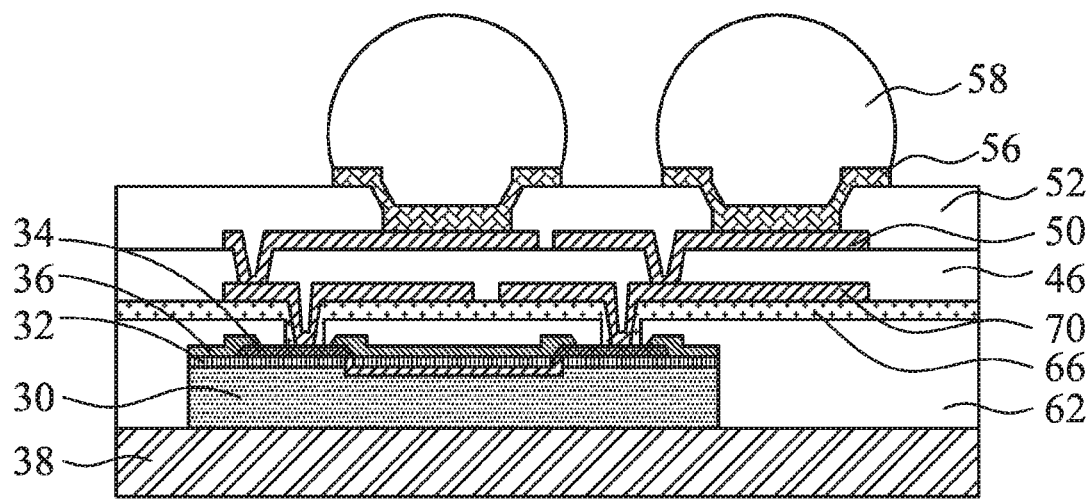

In FIG. 15, the second dielectric layer 46, second conductive pattern 50, third dielectric layer 52, bond pads 56, and external electrical connectors 58 are formed as discussed with respect to FIGS. 4 through 7.

FIGS. 16 through 21 illustrate various intermediate structures in various processes according to embodiments. For example, steps discussed with respect to FIG. 18 may replace steps in FIGS. 16 and 17. As in FIG. 8 above, temporary pillars 60 are formed on pads 34 of the die 30. In an embodiment, the temporary pillars 60 are photoresist pillars. As discussed with respect to the example in FIG. 1, the die 30 may be formed as part of a wafer. Before singulation, a photoresist material may be formed over the wafer and patterned into the photoresist pillars. The wafer is then singulated to form individual dies 30, and the die 30 is attached to the carrier substrate 38 using a die attach film. In other embodiments, the temporary pillars 60 may be any material deposited and patterned, such as by using photolithography and etching techniques, on the pads 34, such as before or after singulation of the die 30.

Figure 16:
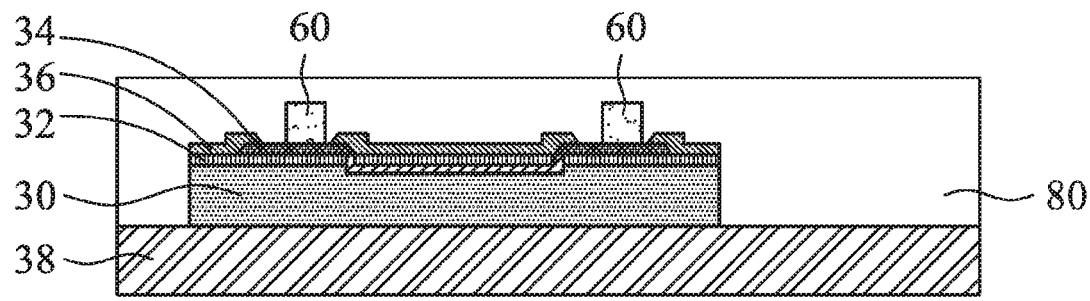
FIGS. 16 through 21 are various intermediate structures in various processes according to further embodiments.
Figure 17:
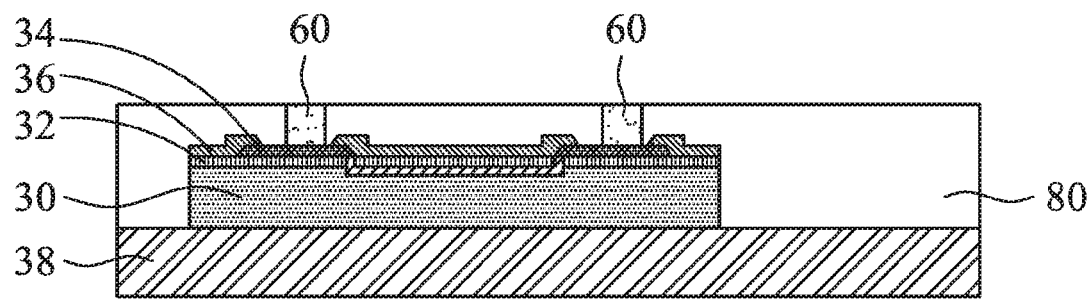

In FIG. 16, a dielectric-encapsulant 80 is formed encapsulating the die 30 to a height greater than the height of the temporary pillars 60, and in FIG. 17, the dielectric-encapsulant 80 is then ground back to expose the temporary pillars 60. The dielectric-encapsulant 80 may be a polymer, such as Ajinomoto Build-up Film (ABF), or the like, and may also have dielectric properties. The dielectric-encapsulant 80 may be formed using a compression molding process, a lamination process, or the like, and then, may be cured. In FIG. 17, the dielectric-encapsulant 80 is ground, such as by using a grinding wheel and/or chemical mechanical polish (CMP), to expose the temporary pillars 60.

Figure 18:
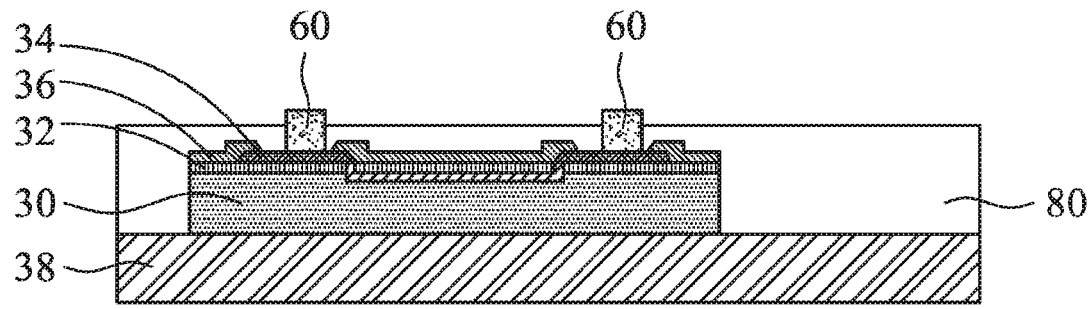
Figure 19:
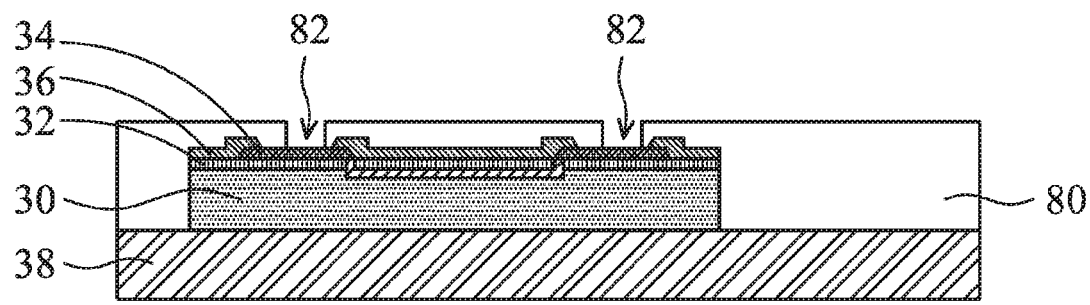

In FIG. 18, the dielectric-encapsulant 80 is formed with the temporary pillars 60 being exposed through the dielectric-encapsulant 80. The temporary pillars 60 may be exposed through the dielectric-encapsulant 80, for example, by using a compression molding process with a compressible and releasable film on a mold plate. When the compression plate with the compressible film contacts the dielectric-encapsulant 80, the temporary pillars 60 may be pressed into the compressible film, and the compressive force may cause the encapsulant to recede to a level below tops portions of the temporary pillars 60. Example materials for a compressible film on the mold plate include silicone, or the like. A compressible film may be, for example, 200 μm thick In FIGS. 17 and 18, the dielectric-encapsulant 80 is formed laterally encapsulating the die 30 and over the passivation layer 36 and pads 34. As shown, the dielectric-encapsulant 80 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. After FIG. 17 or FIG. 18, the temporary pillars 60 are removed to create openings 82 to the pads 34, as shown in FIG. 19. In embodiments where the temporary pillars 60 are a photoresist, the temporary pillars may be removed using an appropriate stripping process. In other embodiments, the temporary pillars may be removed by etching.

Figure 20:
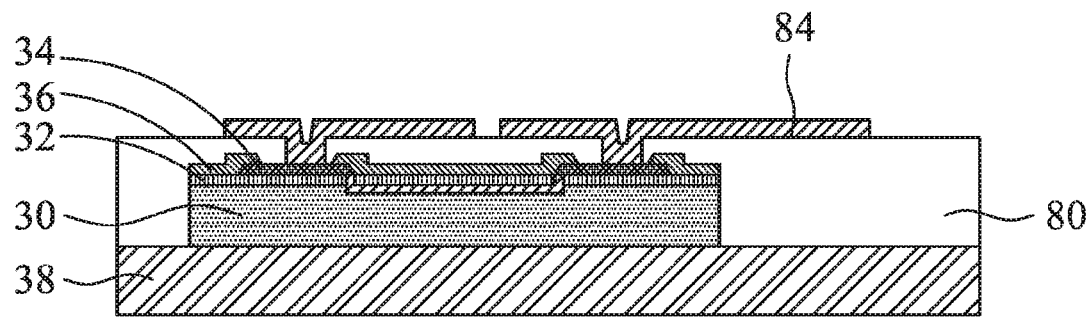

In FIG. 20, a first conductive pattern 84 is formed over the dielectric-encapsulant 80 and in the openings 82 to the pads 34. The first conductive pattern 84 comprises various traces and/or vias. The first conductive pattern 84 in an example comprises a metal such as copper, titanium, the like, or a combination thereof, formed by a plating process, such as electroless plating, electroplating, or the like, such as discussed above with respect to FIG. 3.

Figure 21:
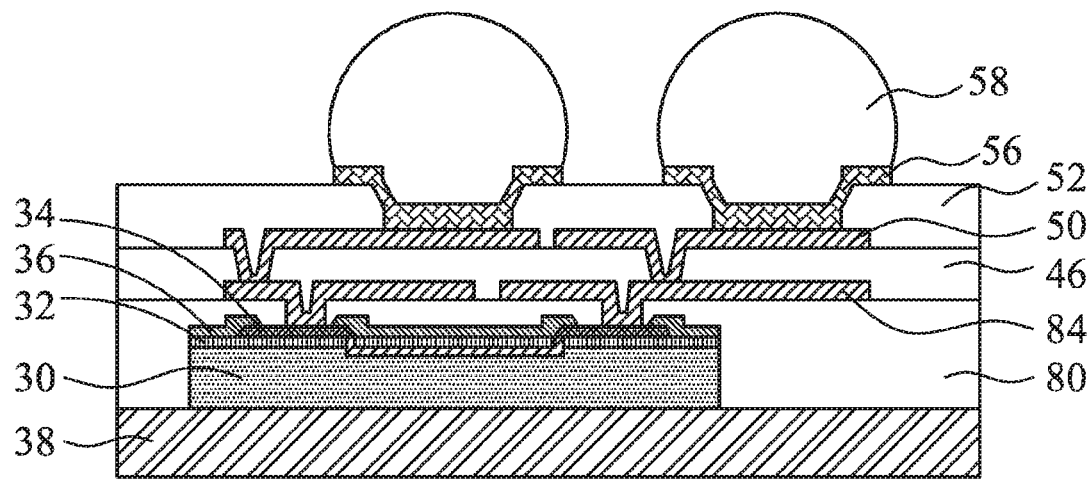

In FIG. 21, the second dielectric layer 46, second conductive pattern 50, third dielectric layer 52, bond pads 56, and external electrical connectors 58 are formed as discussed with respect to FIGS. 4 through 7.

Embodiments may achieve advantages. For example, a cost of fabricating a package according to an embodiment may have reduced costs due to, for example, fewer and/or cheaper processing steps. Additionally, via patterns to pads, e.g., pad 34, may have a more controllable feature size (such as when a critical dimension is between 5 μm and 200 μm), feature size uniformity, sidewall angle, and edge roughness.

An embodiment is a structure comprising a die comprising an electrical pad on an active side, and an encapsulant laterally around the die and extending directly over the active side of the die. A first conductive pattern is over the encapsulant, and the first conductive pattern comprises a first via in a first opening through the encapsulant to the electrical pad. The via contacts the electrical pad.

Another embodiment is a structure comprising a die having an electrical pad on a side, and an encapsulant around the die and over the side of the die. The encapsulant continuously extends from a first region laterally displaced from the die in a direction parallel to the side of the die to a second region directly over the side of the die. A first conductive pattern is over the encapsulant, and the first conductive pattern comprises a first via in a first opening through the encapsulant to the electrical pad. A first dielectric layer is over the encapsulant and the first conductive pattern. A second conductive pattern is over the first dielectric layer, and the second conductive pattern comprises a second via in a second opening through the first dielectric layer to the first conductive pattern.

A further embodiment is a method comprising forming an encapsulant laterally encapsulating a die and over an active surface of the die, the active surface comprising an electrical pad; forming a first opening through the encapsulant to the electrical pad; forming a first conductive pattern over the encapsulant, the first conductive pattern comprising a first via in the first opening to the electrical pad; forming a first dielectric layer over the encapsulant and the first conductive pattern; and forming a second conductive pattern over the first dielectric layer, the second conductive pattern comprising a second via electrically coupled to the first conductive pattern.

Some embodiments include a method comprising depositing an encapsulant laterally encapsulating a die and over an active surface of the die, the active surface including an electrical pad; removing encapuslant to form a first opening through the encapsulant to the electrical pad using a photolithographic technique; and depositing a first conductive pattern over the encapsulant. The first conductive pattern can include a first via in the first opening to the electrical pad.

Some embodiments include a method comprising disposing a temporary pillar on an electrical pad of a die; depositing an encapsulant laterally encapsulating the die and over an active surface of the die, the active surface including the electrical pad; removing the temporary pillar to form a first opening through the encapsulant to the electrical pad; and disposing a first conductive pattern over the encapsulant. The first conductive pattern can include a first via in the first opening to the electrical pad.

Some embodiments include a method comprising disposing a temporary pillar on an electrical pad of a die; depositing an encapsulant laterally encapsulating the die and over an active surface of the die, the active surface including the electrical pad; removing the temporary pillar to form a first opening through the encapsulant to the electrical pad; depositing a first dielectric layer over the encapsulant and in the first opening; patterning the first dielectric layer to form a second opening within the first opening, the first dielectric remaining in contact with sidewalls of the first opening, the second opening reaching the electrical pad; and forming a first conductive pattern over the first dielectric layer. The first conductive pattern can include a first via in the second opening to the electrical pad.

Some embodiments include a method comprising depositing an encapsulant laterally encapsulating a die and over an active surface of the die, the active surface including an electrical pad, the encapsulant including a photo-patternable material. A first opening is formed through the encapsulant to the electrical pad using a photolithographic technique. A first conductive pattern is deposited over the encapsulant, the first conductive pattern including a first via in the first opening to the electrical pad.

Some embodiments include a method comprising depositing an encapsulant completely surrounding an active surface and sidewalls of a die, the die disposed on a carrier, the active surface including an electrical pad. Portions of the encapsulant are exposed to light. A first opening is formed through the encapsulant, exposing the electrical pad. The encapsulant is cured and a first conductive pattern is deposited over the encapsulant, the first conductive pattern contacting the electrical pad.

Some embodiments includes a structure comprising a die including an electrical pad on an active side. An encapsulant is laterally around the die and extends directly over the active side of the die, where a first portion of the encapsulant over the die is continuous with a second portion of the encapsulant laterally surrounding the die, such that no interface is between the first portion and the second portion. The encapsulant includes a cured photo-patternable material. A first conductive pattern is disposed over the encapsulant where the first conductive pattern includes a first trace over the encapsulant and a first via extending through the encapsulant to contact the electrical pad.

Another embodiment is a method including depositing an encapsulant laterally encapsulating a die and over an active surface of the die, the active surface including an electrical pad. A first opening is formed in the encapsulant, the first opening exposing the electrical pad. A first dielectric layer is deposited over the encapsulant and in the first opening, and the first dielectric layer is exposed to a patterned light exposure, the patterned light exposure corresponding to a second opening to be formed in the first dielectric layer. The first dielectric layer is developed after the patterned light exposure to form the second opening, the second opening being aligned to the first opening, the second opening exposing the electrical pad. A first conductive pattern is deposited over the first dielectric layer, the first conductive pattern including a first via in a first opening and in the second opening electrically coupled to the electrical pad.

Another embodiment is a method including depositing an encapsulant completely covering an active surface of a die and surrounding sidewalls of the die, the die disposed on a carrier, the active surface including an electrical pad. A first dielectric layer is deposited over the encapsulant, the first dielectric layer having a first thickness from an upper surface of the first dielectric layer to a lower surface of the first dielectric layer. The first thickness of the first dielectric layer is exposed to a light pattern, the light pattern corresponding to portions of the first dielectric layer which are to be removed in a subsequent developing process. The first dielectric layer is developed to form a first opening through the first dielectric layer, the first opening exposing the electrical pad. A first conductive pattern is deposited over the first dielectric layer, the first conductive pattern electrically coupled to the electrical pad.

Another embodiment is a method including laterally encapsulating a die with an encapsulant, the encapsulant extending over a top surface of the die. A first opening is formed in the encapsulant, the first opening exposing a contact pad of the die. A first dielectric layer is deposited over the encapsulant and in the first opening. The first dielectric layer is photo-patterned without using a separate photoresist mask, to form a second opening through the first dielectric layer to the contact pad. A first conductive pattern is deposited over the first dielectric layer and in the first opening and in the second opening, the first conductive pattern electrically coupled to the contact pad.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   depositing an encapsulant laterally encapsulating a die and over an active surface of the die, the active surface comprising an electrical pad, the electrical pad recessed from an upper surface of the die;
   forming a first opening in the encapsulant, the first opening exposing the electrical pad;
   depositing a first dielectric layer over the encapsulant and in the first opening;

exposing the first dielectric layer to a patterned light exposure, the patterned light exposure corresponding to a second opening to be formed in the first dielectric layer;
developing the first dielectric layer after the patterned light exposure to form the second opening, the second opening being aligned to the first opening, the second opening exposing the electrical pad; and
depositing a first conductive pattern over the first dielectric layer, the first conductive pattern comprising a first via in the first opening and in the second opening electrically coupled to the electrical pad.

2. The method of claim 1, wherein the die includes a pillar disposed on the electrical pad prior to depositing the encapsulant, wherein forming the first opening comprises removing the pillar.

3. The method of claim 2, wherein depositing the encapsulant further comprises depositing the encapsulant over a top surface of the pillar, and wherein forming the first opening further comprises exposing the pillar from the encapsulant prior to removing the pillar.

4. The method of claim 1, wherein the first opening has parallel sidewalls and wherein the second opening has angled sidewalls.

5. The method of claim 1, wherein a portion of the first conductive pattern has an upper surface below an upper surface of the encapsulant.

6. The method of claim 1, further comprising:
prior to depositing the encapsulant, forming a pillar on the electrical pad, the pillar comprising a photoresist material.

7. The method of claim 1, further comprising:
depositing a second dielectric layer over the first conductive pattern;
removing a portion of the second dielectric layer to form a third opening through the second dielectric layer to the first conductive pattern; and
depositing a second conductive pattern over the second dielectric layer, the second conductive pattern comprising a second via in the third opening, the second via electrically coupled to the first conductive pattern.

8. The method of claim 7, wherein removing the portion of the second dielectric layer comprises:
exposing the second dielectric layer to a second patterned light exposure, the second patterned light exposure corresponding to the third opening; and
developing the second dielectric layer after the patterned light exposure to form the third opening.

9. A method comprising:
depositing an encapsulant completely covering an active surface of a die and surrounding sidewalls of the die, the die disposed on a carrier, the active surface comprising an electrical pad;
forming a first opening in the encapsulant,
depositing a first dielectric layer over the encapsulant, the first dielectric layer having a first thickness from an upper surface of the first dielectric layer to a lower surface of the first dielectric layer;
exposing the first thickness of the first dielectric layer to a light pattern, the light pattern corresponding to portions of the first dielectric layer which are to be removed in a subsequent developing process;
developing the first dielectric layer to form a second opening through the first dielectric layer, the second opening exposing the electrical pad, wherein the second opening is formed within lateral extents of the first opening; and
depositing a first conductive pattern over the first dielectric layer, the first conductive pattern electrically coupled to the electrical pad.

10. The method of claim 9, wherein forming the first opening comprises: exposing an upper surface of a temporary pillar, the temporary pillar disposed on the electrical pad; and
removing the temporary pillar by an etching or stripping process, thereby forming the first opening in the encapsulant.

11. The method of claim 10, wherein exposing the upper surface of the temporary pillar comprises compressing the encapsulant until the upper surface of the temporary pillar protrudes from the encapsulant.

12. The method of claim 9, wherein a portion of the first conductive pattern which is aligned to the electrical pad has an upper surface below an uppermost surface of the encapsulant.

13. The method of claim 9, wherein the first opening has vertical sidewalls and wherein the second opening has angled sidewalls.

14. The method of claim 9, further comprising:
depositing a second dielectric layer over the first dielectric layer and over the first conductive pattern;
removing a portion of the second dielectric layer to form a third opening through the second dielectric layer, the third opening exposing a portion of the first conductive pattern; and
depositing a second conductive pattern over the second dielectric layer and in the third opening, the second conductive pattern electrically coupled to the first conductive pattern.

15. The method of claim 14, wherein removing the portion of the second dielectric layer comprises:
exposing a first thickness of the second dielectric layer to a second light pattern, the second light pattern corresponding to portions of the second dielectric layer which are to be removed in a subsequent developing process; and
developing the second dielectric layer to form the third opening through the second dielectric layer, the third opening exposing the electrical pad.

16. A method comprising:
laterally encapsulating a die with an encapsulant, the encapsulant extending over a top surface of the die and over a top surface of a contact pad of the die;
forming a first opening in the encapsulant, the first opening exposing the contact pad of the die, wherein after forming the first opening the encapsulant overlaps edges of the contact pad and is in contact with the top surface of the contact pad;
depositing a first dielectric layer over the encapsulant and in the first opening;
photo-patterning the first dielectric layer without using a separate photoresist mask, to form a second opening through the first dielectric layer to the contact pad; and
depositing a first conductive pattern over the first dielectric layer and in the first opening and in the second opening, the first conductive pattern electrically coupled to the contact pad.

17. The method of claim 16, wherein forming the first opening comprises:
exposing an upper surface of a temporary pillar, the temporary pillar disposed on the contact pad; and
removing the temporary pillar by an etching or stripping process to form the first opening in the encapsulant.

18. The method of claim 17, wherein exposing the upper surface of the temporary pillar comprises grinding an upper surface of the encapsulant covering the temporary pillar until the upper surface of the temporary pillar is exposed.

19. The method of claim 16, wherein after forming the second opening, sidewalls of the first opening remain covered by sidewalls of the second opening.

20. The method of claim 17, wherein the temporary pillar comprises a photoresist material.

* * * * *